United States Patent
Chen (10) Patent No.: US 10,505,156 B2
(45) Date of Patent: Dec. 10, 2019

(54) METHOD OF PATTERNING QUANTUM DOT LAYER, QUANTUM DOT LIGHT EMITTING DEVICE, AND METHOD OF MANUFACTURING THE SAME

(71) Applicant: BOE Technology Group Co., Ltd., Beijing (CN)

(72) Inventor: Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/926,027

(22) Filed: Mar. 20, 2018

(65) Prior Publication Data

US 2019/0131587 A1 May 2, 2019

(30) Foreign Application Priority Data

Oct. 30, 2017 (CN) .......................... 2017 1 1037640

(51) Int. Cl.
*H01L 51/56* (2006.01)
*H01L 51/00* (2006.01)
*H01L 51/50* (2006.01)

(52) U.S. Cl.
CPC .......... *H01L 51/56* (2013.01); *H01L 51/0026* (2013.01); *H01L 51/502* (2013.01);
(Continued)

(58) Field of Classification Search
CPC ... H01L 51/56; H01L 51/5056; H01L 51/504; H01L 51/0026; H01L 51/0043;
(Continued)

(56) References Cited

U.S. PATENT DOCUMENTS 10,224,483 B2   3/2019  Li et al.
2003/0044639 A1*  3/2003  Fukuda ............... H01L 27/3211
                                                    428/690
(Continued)

FOREIGN PATENT DOCUMENTS

CN    101425565 A    5/2009
CN    103962112 A    8/2014
(Continued)

OTHER PUBLICATIONS

First Office Action, including Search Report, for Chinese Patent Application No. 201711037640.X, dated Dec. 28, 2018, 13 pages.
(Continued)

*Primary Examiner* — Kyoung Lee
*Assistant Examiner* — Christina A Sylvia
(74) *Attorney, Agent, or Firm* — Westman, Champlin & Koehler, P.A.

(57) ABSTRACT

The present disclosure discloses a method of patterning a quantum dot layer, a method of manufacturing a quantum dot light emitting device, and a quantum dot light emitting device. The patterning method includes the steps of: forming on a substrate a layer of film comprising a photosensitive material; irradiating a first preset region of the layer of film with light having a preset wavelength; forming a first quantum dot layer, wherein the photosensitive material in the first preset region of the layer of film is combined with a first quantum dot in the first quantum dot layer; and removing a first quantum dot in the first quantum dot layer that is not combined with the photosensitive material.

18 Claims, 10 Drawing Sheets

(52) U.S. Cl.
CPC ........ *H01L 51/504* (2013.01); *H01L 51/5056* (2013.01); *H01L 51/5088* (2013.01); *H01L 51/006* (2013.01); *H01L 51/0039* (2013.01); *H01L 51/0043* (2013.01); *H01L 51/0058* (2013.01); *H01L 51/0093* (2013.01)

(58) Field of Classification Search
CPC ............. H01L 51/0039; H01L 51/0058; H01L 51/0093; H01L 51/006
See application file for complete search history.

(56) References Cited

U.S. PATENT DOCUMENTS

| | | | | |
|---|---|---|---|---|
| 2007/0032091 | A1* | 2/2007 | Heald | ............... H01L 21/28273 438/758 |
| 2009/0085473 | A1 | 4/2009 | Ilzumi et al. | |
| 2016/0322592 | A1* | 11/2016 | Park | ..................... H01L 51/447 |
| 2018/0062101 | A1 | 3/2018 | Li et al. | |
| 2018/0102093 | A1* | 4/2018 | Kim | ........................ H01L 33/06 |
| 2018/0108841 | A1 | 4/2018 | Li et al. | |
| 2018/0108842 | A1 | 4/2018 | Li et al. | |

FOREIGN PATENT DOCUMENTS

| | | |
|---|---|---|
| CN | 104059114 A | 9/2014 |
| CN | 105449111 A | 3/2016 |
| CN | 105514302 A | 4/2016 |
| CN | 105552241 A | 5/2016 |
| CN | 106468858 A | 3/2017 |
| CN | 106995512 A | 8/2017 |
| CN | 107129556 A | 9/2017 |

OTHER PUBLICATIONS

Second Office Action, including Search Report, for Chinese Patent Application No. 201711037640.X, dated Sep. 29, 2019, 19 pages.

* cited by examiner

METHOD OF PATTERNING QUANTUM DOT LAYER, QUANTUM DOT LIGHT EMITTING DEVICE, AND METHOD OF MANUFACTURING THE SAME

CROSS-REFERENCE TO RELATED APPLICATION

The present disclosure claims the benefit of Chinese Patent Application No. 201711037640.X, entitled "method of patterning quantum dot layer, quantum dot light emitting device and method of manufacturing the same" and filed on Oct. 30, 2017 before the State Intellectual Property Office of China, the entirety of which is incorporated herein by reference.

BACKGROUND OF THE DISCLOSURE

Field of the Disclosure

The present disclosure relates to the field of display technology, and in particular to a method of patterning a quantum dot layer, a method of manufacturing a quantum dot light emitting device, and a quantum dot light emitting device.

Description of the Related Art

With the further development of the quantum dot preparation technology, the stability of the quantum dot and the luminous efficiency are continuously improved, and the research with respect to Quantum Light Emitting Diode (QLED) is gradually deepen, and the application prospect of QLED in the display field becomes increasingly bright. However, the production efficiency of QLED has not yet reached the level of mass production; one of the main reasons is that the high-resolution patterning technology for QLED has not yet made a breakthrough.

The quantum dot is a zero-dimensional nano-semiconductor material, and the sizes of the quantum dot in all three dimensions are not greater than twice the exciton Bohr radius of its corresponding semiconductor material. In the related art, when a patterned quantum dot is manufactured, the patterned quantum dot cannot be produced by forming a film via a vapor deposition technology and then patterning the film due to the characteristics of inorganic nano-particles of the quantum dot.

SUMMARY

According to one aspect of the present disclosure, there is provided a method of patterning a quantum dot layer, comprising the steps of:
  forming on a substrate a layer of film comprising a photosensitive material;
  irradiating a first preset region of the layer of film with light having a preset wavelength;
  forming a first quantum dot layer, wherein the photosensitive material in the first preset region of the layer of film is combined with a first quantum dot in the first quantum dot layer; and
  removing a first quantum dot in the first quantum dot layer that is not combined with the photosensitive material.

In an embodiment, the photosensitive material has a first configuration, and the step of irradiating a first preset region of the layer of film with light having a preset wavelength changes the photosensitive material in the first preset region of the layer of film into a second configuration.

In an embodiment, the first quantum dot comprises a quantum dot ligand capable of combining with the photosensitive material in the second configuration.

In an embodiment, the patterning method further comprises drying and annealing the first quantum dot layer after the step of forming the first quantum dot layer.

In an embodiment, the patterning method further comprises the steps of:
  irradiating a second preset region of the layer of film with light having a preset wavelength;
  forming a second quantum dot layer, wherein the photosensitive material in the second preset region of the layer of film is combined with a second quantum dot in the second quantum dot layer; and
  removing a second quantum dot in the second quantum dot layer that is not combined with the photosensitive material;
  wherein the color of light emitted by the second quantum dot is different from the color of light emitted by the first quantum dot.

In an embodiment, the patterning method further comprises the steps of:
  irradiating a third preset region of the layer of film with light having a preset wavelength;
  forming a third quantum dot layer, wherein the photosensitive material in the third preset region of the layer of film is combined with a third quantum dot in the third quantum dot layer; and
  removing a third quantum dot in the third quantum dot layer that is not combined with the photosensitive material;
  wherein the color of light emitted by the third quantum dot is different from both the color of light emitted by the first quantum dot and the color of light emitted by the second quantum dot.

In an embodiment, the color of light emitted by the first quantum dot, the color of light emitted by the second quantum dot and the color of light emitted by the third quantum dot each are different colors selected from a group consisting of red, green, and blue.

In an embodiment, in the step of irradiating a first preset region of the layer of film with light having a preset wavelength, the layer of film is masked with a mask comprising a light-transmitting region and a light-blocking region, the light-transmitting region corresponding to the first preset region to be irradiated of the layer of film.

In an embodiment, the first quantum dot in the first quantum dot layer that is not combined with the photosensitive material is removed by a solvent.

In an embodiment, the quantum dot ligand has a structure of cyclodextrin; and the photosensitive material comprises an azobenzene photosensitive group.

In an embodiment, the layer of film comprising a photosensitive material is a hole transport layer.

According to a further aspect of the present disclosure, there is provided a method of manufacturing a quantum dot light emitting device, comprising the steps of:
  forming an anode on a substrate;
  forming a hole transport layer comprising a photosensitive material on the anode;
  irradiating a first preset region of the hole transport layer with light having a preset wavelength;
  forming a first quantum dot layer on the hole transport layer, wherein the photosensitive material in the first preset region of the hole transport layer is combined with a first quantum dot in the first quantum dot layer;

removing a first quantum dot in the first quantum dot layer that is not combined with the photosensitive material;

forming an electron transport layer; and forming a cathode on the electron transport layer.

In an embodiment of a method of manufacturing a quantum dot light emitting device according to the present disclosure, the photosensitive material has a first configuration, and the step of irradiating a first preset region of the hole transport layer with light having a preset wavelength changes the photosensitive material in the first preset region of the hole transport into a second configuration.

In an embodiment of a method of manufacturing a quantum dot light emitting device according to the present disclosure, the first quantum dot comprises a quantum dot ligand capable of combining with the photosensitive material in the second configuration.

In an embodiment of a method of manufacturing a quantum dot light emitting device according to the present disclosure, the method further comprises the following steps before forming the electron transport layer:

irradiating a second preset region of the hole transport layer with light having a preset wavelength;

forming a second quantum dot layer, wherein the photosensitive material in the second preset region of the hole transport layer is combined with a second quantum dot in the second quantum dot layer; and removing a second quantum dot in the second quantum dot layer that is not combined with the photosensitive material;

wherein the color of light emitted by the second quantum dot is different from the color of light emitted by the first quantum dot.

In an embodiment of a method of manufacturing a quantum dot light emitting device according to the present disclosure, the method further comprises the following steps before forming the electron transport layer:

irradiating a third preset region of the hole transport layer with light having a preset wavelength;

forming a third quantum dot layer, wherein the photosensitive material in the third preset region of the hole transport layer is combined with a third quantum dot in the third quantum dot layer; and removing a third quantum dot in the third quantum dot layer that is not combined with the photosensitive material;

wherein the color of light emitted by the third quantum dot is different from both the color of light emitted by the first quantum dot and the color of light emitted by the second quantum dot.

In an embodiment of a method of manufacturing a quantum dot light emitting device according to the present disclosure, the first quantum dot in the first quantum dot layer that is not combined with the photosensitive material is removed by a solvent.

In an embodiment of a method of manufacturing a quantum dot light emitting device according to the present disclosure, the quantum dot ligand has a structure of cyclodextrin; and the photosensitive material comprises an azobenzene photosensitive group.

In an embodiment of a method of manufacturing a quantum dot light emitting device according to the present disclosure, the method further comprises forming a hole injection layer on the anode prior to the step of forming a hole transport layer comprising a photosensitive material on the anode.

According to a still further aspect of the present disclosure, there is provided a quantum dot light emitting device manufactured by the method of manufacturing a quantum dot light emitting device according to the present disclosure.

BRIEF DESCRIPTION OF THE DRAWINGS

The foregoing and/or additional aspects and advantages of the present disclosure will become apparent and readily understood from the following description of the embodiments, taken in conjunction with the accompanying drawings, in which.

DETAILED DESCRIPTION OF PREFERRED EMBODIMENTS OF THE DISCLOSURE

The embodiments of the present disclosure are described in detail below, and examples of the embodiments are shown in the drawings, wherein same or similar reference numerals throughout denote same or similar elements or elements having the same or similar functions. The embodiments described below with reference to the drawings are exemplary only for the purpose of illustration of the present disclosure and are not to be construed as limiting the present disclosure.

In the related art, a patterned quantum dot is generally produced by an inkjet printing method, and it is difficult to achieve a higher resolution by such a method. Therefore, in order to improve the resolution of the product, a photolithographic method is used to fabricate a patterned quantum dot. The photolithography method includes an exposure process by which the performance of the quantum dot is likely impacted. Therefore, in the related art, it is difficult to make a high-resolution quantum dot with good performance.

In the present disclosure, the configuration of photosensitive material may be understood as a spatial arrangement of some groups in the photosensitive material. Such a spatial arrangement may be changed by light irradiation, and a chemical reaction does not necessarily occur in this process. The presence of different configurations, such as cis-configuration and trans-configuration, may be attributed to the presence of a double bond.

In the present disclosure, due to the patterned distribution of quantum dots, a plurality of quantum dot layers formed in multiple times do not necessarily appear to be independent layers at different heights with respect to the substrate, and may actually be formed as a same layer.

In the present disclosure, when the combination of a photosensitive material and a quantum dot is concerned, "combined", "tightly combined" and "strongly combined" mean that the adhesion between the photosensitive material and the quantum dot is such that the quantum dot will not be removed in a subsequent step of removing the quantum dot. Further, "not combined" and "weakly combined" mean that the adhesion between the photosensitive material and the quantum dot is such that the quantum dot will be removed in the subsequent step of removing the quantum dot.

Figure 1:
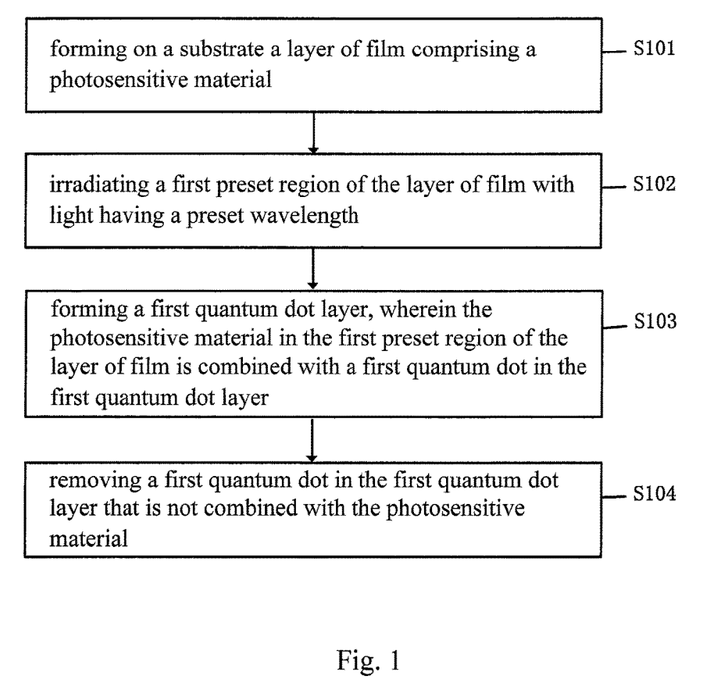
FIG. 1 is a flowchart of a method of patterning a quantum dot layer according to an embodiment of the present disclosure.

As shown in FIG. 1, an embodiment of the present disclosure discloses a method of patterning a quantum dot layer, including the steps of:

S101. forming on a substrate a layer of film comprising a photosensitive material;

S102. irradiating a first preset region of the layer of film with light having a preset wavelength;

S103. forming a first quantum dot layer, wherein the photosensitive material in the first preset region of the layer of film is combined with a first quantum dot in the first quantum dot layer; and S104. removing a first quantum dot in the first quantum dot layer that is not combined with the photosensitive material.

In an embodiment of the present disclosure, before forming a quantum dot layer, a layer of film comprising a photosensitive material is first formed on the substrate, and then the preset region of the layer of film is irradiated by light having a preset wavelength. The preset wavelength may be a wavelength that may bring about a certain change of configuration of the photosensitive material. The preset region refers to a region in which the quantum dot needs to be reserved. A quantum dot layer is then formed. The photosensitive material with a change of configuration caused by irradiation with light having a preset wavelength in the preset region is tightly combined with the quantum dot in the quantum dot layer, and there is a high adhesion, whereas the adhesion between the photosensitive material without change of configuration in a non-irradiated region and the quantum dot in the quantum dot layer is weak. Finally, the quantum dot in the quantum dot layer that is not combined with the photosensitive material is removed and the patterning of the quantum dot layer is completed. The expression "the photosensitive material is not combined with the quantum dot" described herein means that the photosensitive material without change of configuration cannot be fitted with a quantum dot material and they cannot be combined with each other, resulting in a weak adhesion therebetween. Therefore, the embodiment of the present disclosure may realize the patterning of a quantum dot layer without the need of ink jet printing or photolithography, and may form quantum dots with high-resolution and good-performance. The above steps will be described in detail in the following.

In one embodiment, in the above step S101 of the embodiment of the present disclosure, the photosensitive material has a first configuration.

In one embodiment, in the above step S102 of the embodiment of the present disclosure, the configuration of the photosensitive material in the first preset region of the layer of film is changed into a second configuration by irradiating the first preset region of the layer of film with light having a preset wavelength. In the embodiment of the present disclosure, the first preset region of the layer of film is irradiated by the light having a preset wavelength, so that the photosensitive material in the first preset region has a configuration different from that of the photosensitive material in other region. In this way, when a quantum dot layer is subsequently formed, the combining forces between the photosensitive material in different configurations and the quantum dot in the quantum dot layer will be different. For example, the photosensitive material in the second configuration is strongly combined with the quantum dot in the quantum dot layer, whereas the photosensitive material in the non-irradiated region is weakly combined with the quantum dot.

Figure 2:
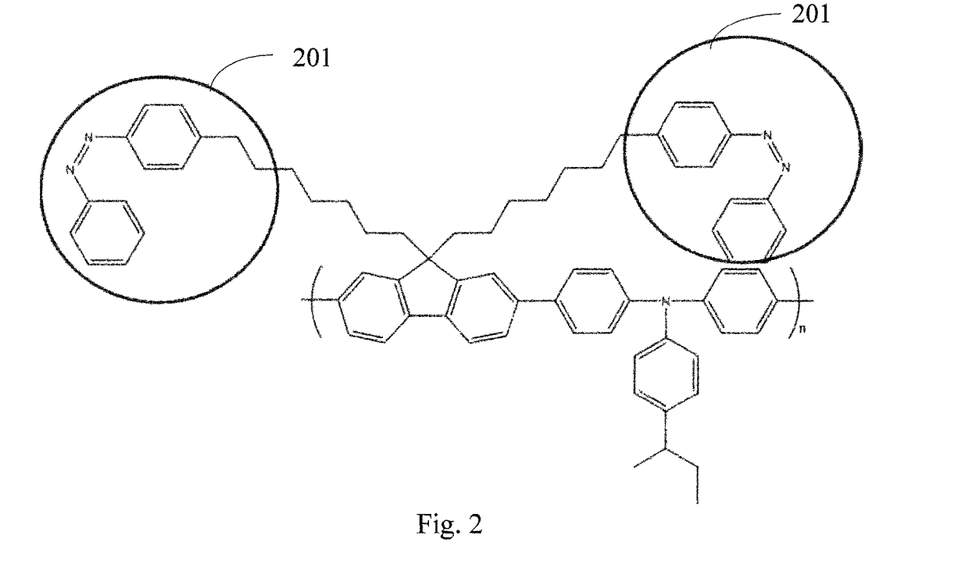
FIG. 2 is a chemical formula of a photosensitive material according to an embodiment of the present disclosure.
Figure 3:
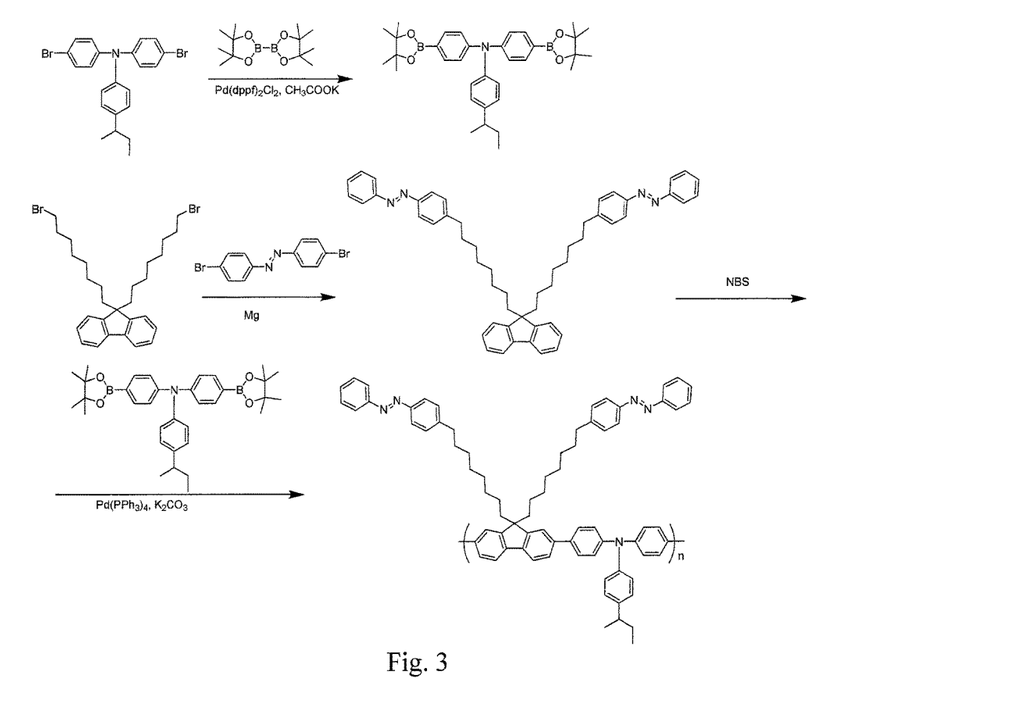
FIG. 3 is a synthetic route diagram of a material for a hole transport layer according to an embodiment of the present disclosure.

In one embodiment, as shown in FIG. 2, the layer of film comprising a photosensitive material in the sense of the embodiments of the present disclosure is a hole transport layer, and the photosensitive material comprises an azobenzene (azo) photosensitive group 201, and the hole transport layer in the embodiment of the present disclosure is obtained from modified poly (9,9-dioctylfluorene-co-N-(4-butylphenyl)diphenylamine) (TFB), and the specific synthetic route for the modification is shown in FIG. 3. TFB is commonly-used polymeric hole transport material.

As shown in FIG. 2, the first configuration of the photosensitive material comprising azobenzene photosensitive group 201 is a cis-configuration. The photosensitive material is changed into a second configuration, i.e. a trans-configuration, after irradiation with light having a preset wavelength. In this case, the preset wavelength is 533 nanometers (nm). After the photosensitive material comprising the azobenzene photosensitive group 201 is irradiated with visible light at 533 nm, the configuration of azobenzene photosensitive group 201 may be changed from cis-configuration into trans-configuration.

In one embodiment, for the above step S103 of the embodiment of the present disclosure, the quantum dot comprises a quantum dot ligand capable of combining with the photosensitive material in the second configuration.

Figure 4:
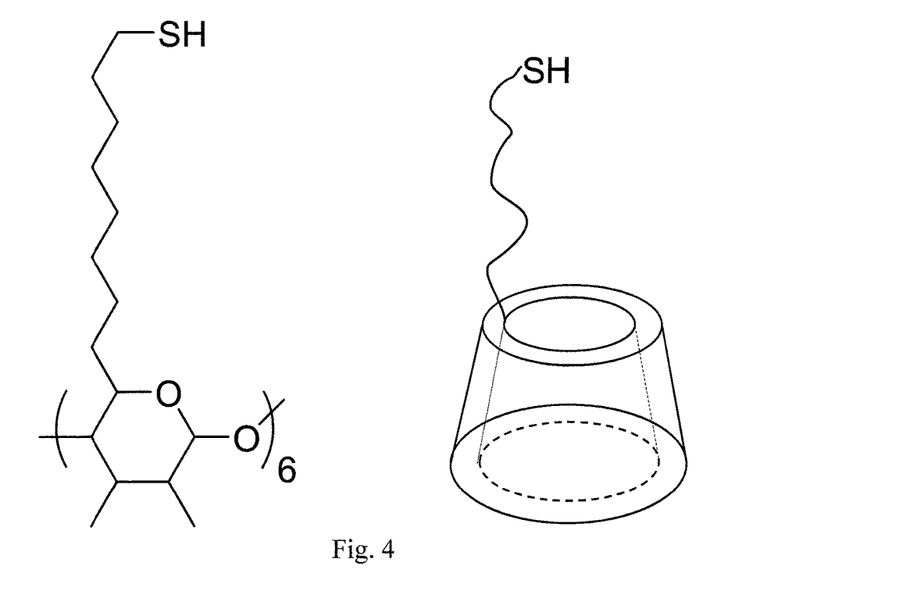
FIG. 4 is a chemical formula and a schematic structural diagram of a quantum dot ligand according to an embodiment of the present disclosure.

In one embodiment, as shown in FIG. 4, the quantum dot ligand has a structure of cyclodextrin. Cyclodextrin (CD) is a generic term for a serial of cyclic oligosaccharides produced by amylose under the action of cyclodextrin glucosyltransferase produced by Bacillu, and the chemical formula thereof is $C_{14}H_8O_2$. The cyclodextrin molecule has a slightly conically cylindrical, three-dimensional, hollow ring structure, that is, the cyclodextrin structure has a cage configuration.

Figure 5:
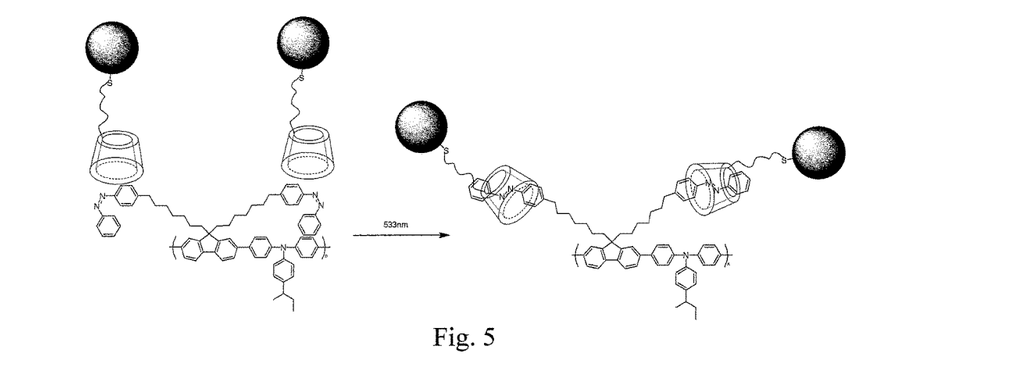
FIG. 5 is a schematic illustration of a photosensitive reaction and a combination of a photosensitive material and a quantum dot ligand according to an embodiment of the present disclosure.

As shown in FIG. 5, the azobenzene photosensitive group was in cis-configuration before the photosensitive material comprising the azobenzene photosensitive group was irradiated with visible light at 533 nm. At that time, the azobenzene photosensitive group may not be inserted into the cyclodextrin structure having the cage configuration due to steric hindrance. After the photosensitive material comprising the azobenzene photosensitive group is irradiated with visible light at 533 nm, the azobenzene photosensitive group is changed from cis-configuration into trans-configuration. Then, the trans-configuration of the azobenzene photosensitive group may be matched with the cage configuration of cyclodextrin, and thus the azobenzene photosensitive group may be inserted into the cyclodextrin structure having the cage configuration so as to form a structure where host and guest are tightly combined.

In order to enhance the combination between the photosensitive material in the preset region of the layer of film and the quantum dot, the patterning method further includes the step of drying and annealing the quantum dot layer after the step of forming the quantum dot layer, so that the quantum dot in the quantum dot layer may be combined more tightly with the photosensitive material in the preset region. In the specific implementation, the process parameters of the step of drying and annealing may be set according to actual production requirements.

In one embodiment, in the above step S104 of the embodiment of the present disclosure, the quantum dot in the quantum dot layer that is not combined with the photosensitive material is removed by a solvent. The method of removing quantum dot by a solvent is more simple and practical in the actual production process, and the production cost is lower.

The method of patterning a quantum dot layer according to the specific embodiments of the present disclosure is described in detail below with reference to the accompanying drawings.

Figure 6:
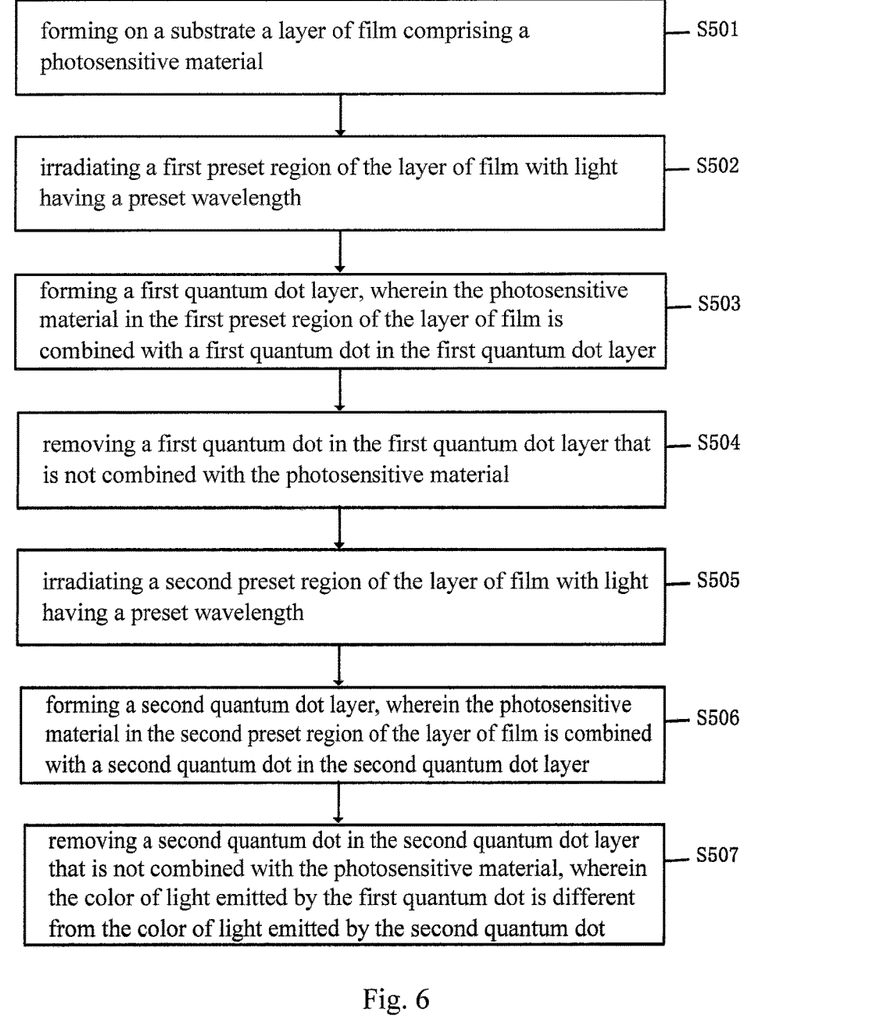
FIG. 6 is a flowchart of a specific method of patterning a quantum dot layer according to an embodiment of the present disclosure.

As shown in FIG. 6, a specific example of the method of patterning a quantum dot layer provided by an embodiment of the present disclosure includes the steps of:

S501. forming on a substrate a layer of film comprising a photosensitive material;

S502. irradiating a first preset region of the layer of film with light having a preset wavelength;

S503. forming a first quantum dot layer, wherein the photosensitive material in the first preset region of the layer of film is combined with a first quantum dot in the first quantum dot layer;

S504. removing a first quantum dot in the first quantum dot layer that is not combined with the photosensitive material;

S505. irradiating a second preset region of the layer of film with light having a preset wavelength;

S506. forming a second quantum dot layer, wherein the photosensitive material in the second preset region of the layer of film is combined with a second quantum dot in the second quantum dot layer; and S507. removing a second quantum dot in the second quantum dot layer that is not combined with the photosensitive material, wherein the color of light emitted by the first quantum dot is different from the color of light emitted by the second quantum dot.

The above steps will each be described in detail with reference to the accompanying drawings.

In the drawings, the thickness of the layers of film and the size and shape of the regions do not reflect the true proportions of the layers of film, and are merely intended to illustrate the disclosure.

Figure 7A:
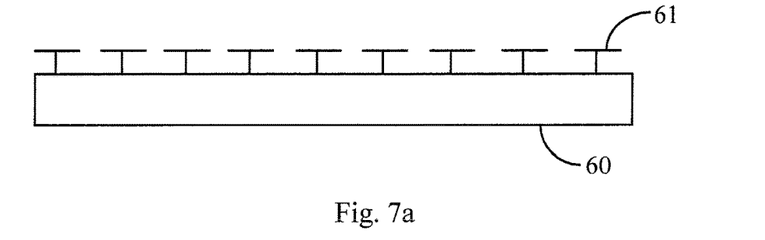
FIGS. 7a-7e are schematic diagrams showing a process of forming a first quantum dot layer according to an embodiment of the present disclosure.

As shown in FIG. 7a, a layer of film 61 including a photosensitive material is formed on a substrate 60. In one example, the layer of film 61 includes an azobenzene photosensitive group. The substrate 60 may be a transparent glass substrate or a glass substrate on which other layers of film are formed.

Figure 7B:
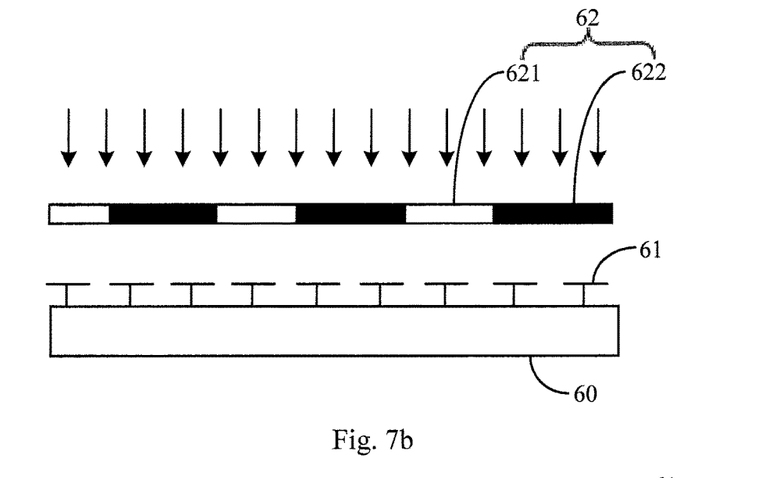

As shown in FIG. 7b, a first preset region of the layer of film 61 is irradiated with light having a preset wavelength (indicated by an arrow in the figure), and the first preset region corresponds to the region in which the first quantum dot needs to be reserved subsequently. In the specific implementation, according to the embodiments of the present disclosure, the layer of film 61 may be irradiated with visible light at 533 nm. When irradiated, the layer of film 61 is masked with a mask 62. The mask 62 includes a light-transmitting region 621 and a light-blocking region 622. The light-transmitting region 621 corresponds to a light-receiving region of the layer of film 61, i.e. the first preset region.

Figure 7C:
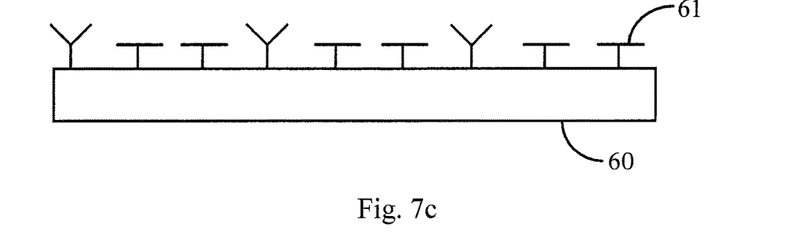

As shown in FIG. 7c, the configuration of photosensitive material in the first preset region of the layer of film 61 is changed. In order to more visually show the configuration change of the photosensitive material in the first preset region of the layer of film 61, in the drawing, the change is shown by a change from a straight line representing the photosensitive material in the first preset region of the layer of film 61 into a broken line. In the specific implementation, the layer of film 61 contains, for example, an azobenzene photosensitive group, whose configuration is changed from a cis-configuration into a trans-configuration.

Figure 7D:
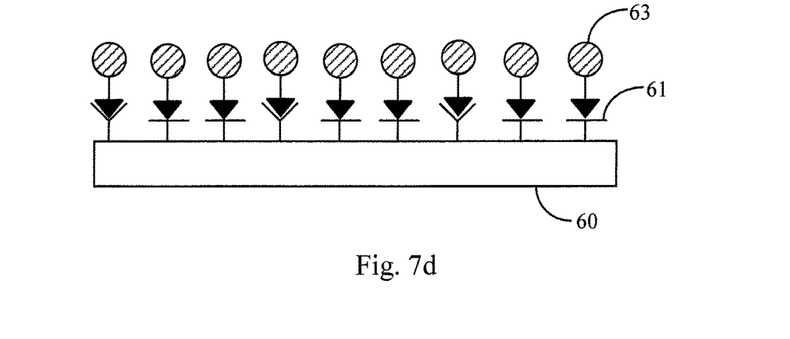

As shown in FIG. 7d, a first quantum dot layer 63 is then formed, and the first quantum dot in the first quantum dot layer 63 is combined with the photosensitive material in the first preset region of the layer of film 61. In the specific implementation, the first quantum dot layer 63 contains, for example, a quantum dot ligand having a structure of cyclodextrin. Since the azobenzene photosensitive group in the first preset region is in a trans-configuration, the first quantum dot in the first quantum dot layer 63 may be tightly combined with the photosensitive material in the first preset region.

Figure 7E:
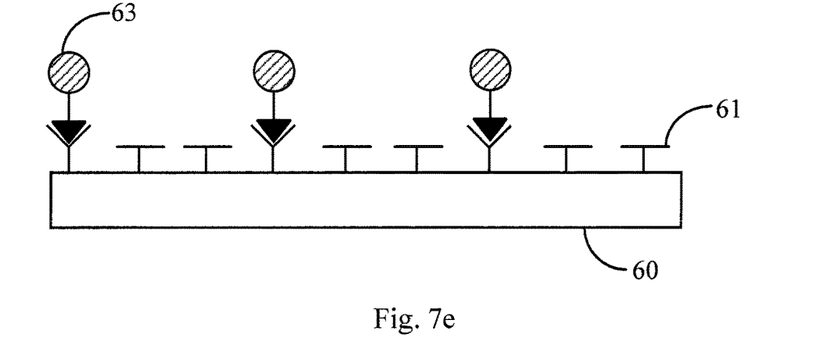

As shown in FIG. 7e, the first quantum dot in the first quantum dot layer 63 that is not combined with the photosensitive material is removed to complete the patterning of the first quantum dot layer. In the specific implementation, except the azobenzene photosensitive group in the first preset region that is in trans-configuration, all the azobenzene photosensitive groups in other regions are in cis-configuration, and the first quantum dot in the first quantum dot layer 63 is weakly combined with the azobenzene photosensitive group in cis-configuration, and therefore the first quantum dot that is not tightly combined with the photosensitive material may be removed easily by solvent.

Figure 8A:
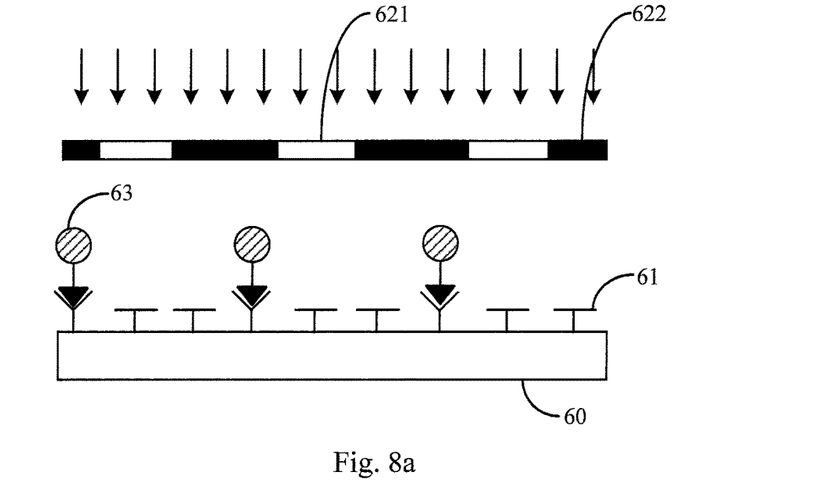
FIGS. 8a-8d are schematic diagrams showing a process of forming a second quantum dot layer according to an embodiment of the present disclosure.

As shown in FIG. 8a, a second preset region of the layer of film 61 is irradiated with light having a preset wavelength (indicated by an arrow in the figure), and the second preset region corresponds to the region in which the second quantum dot needs to be reserved subsequently. In the specific implementation, according to the embodiments of the present disclosure, the layer of film 61 may be irradiated with visible light at 533 nm. When irradiated, the layer of film 61 is masked with a mask, the light-transmitting region 621 of which corresponds to the second preset region of the layer of film 61.

Figure 8B:
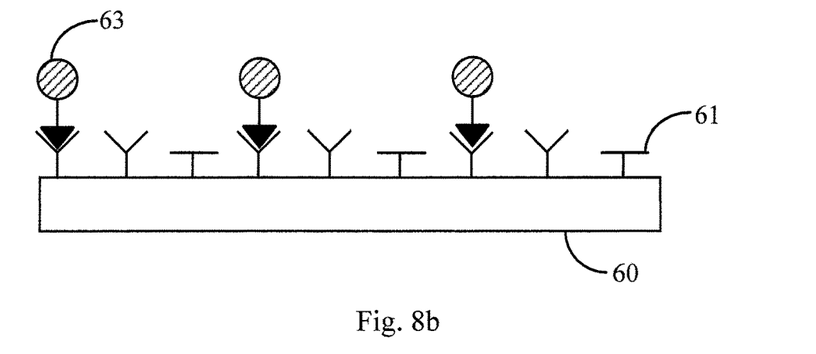

As shown in FIG. 8b, the configuration of photosensitive material in the second preset region of the layer of film 61 is changed. In the specific implementation, the layer of film 61 contains, for example, an azobenzene photosensitive group, whose configuration is changed from a cis-configuration to a trans-configuration.

Figure 8C:
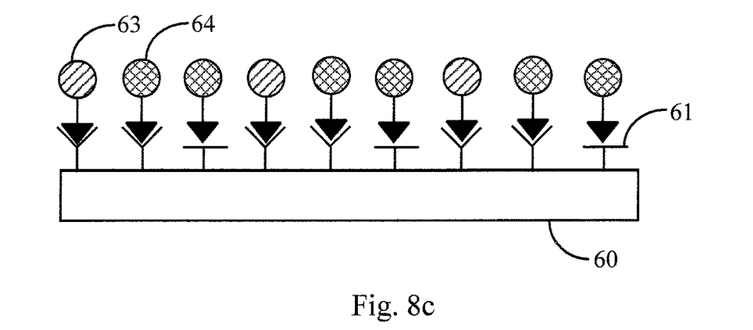

As shown in FIG. 8c, a second quantum dot layer 64 is then formed, and the second quantum dot in the second quantum dot layer 64 is combined with the photosensitive material in the second preset region of the layer of film 61.

In the specific implementation, the second quantum dot layer 64 contains, for example, a quantum dot ligand having a structure of cyclodextrin. Since the azobenzene photosensitive group in the second preset region is in a trans-configuration, the second quantum dot in the second quantum dot layer 64 may be tightly combined with the photosensitive material in the second preset region.

Figure 8D:
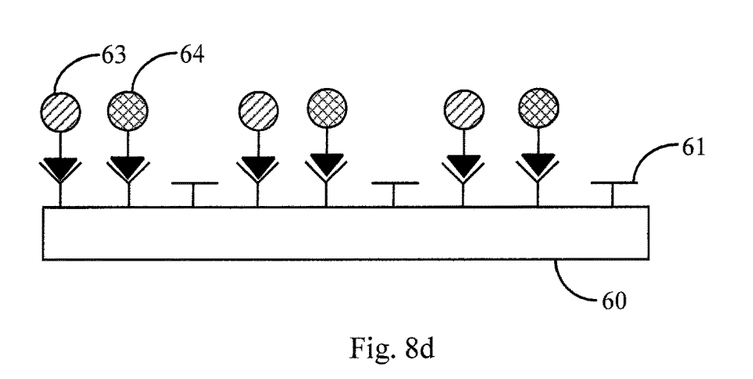

As shown in FIG. 8d, the second quantum dot in the second quantum dot layer 64 that is not combined tightly with the photosensitive material is removed to complete the patterning of the second quantum dot layer. In the specific implementation, the second quantum dot that is not combined tightly with the photosensitive material may be removed by a solvent.

In the embodiments of the present disclosure, the color of light emitted by the first quantum dot is different from the color of light emitted by the second quantum dot. In the specific implementation, the light emitted by the first quantum dot may be red, green or blue, and the light emitted by the second quantum dot may also be red, green or blue.

Figure 9:
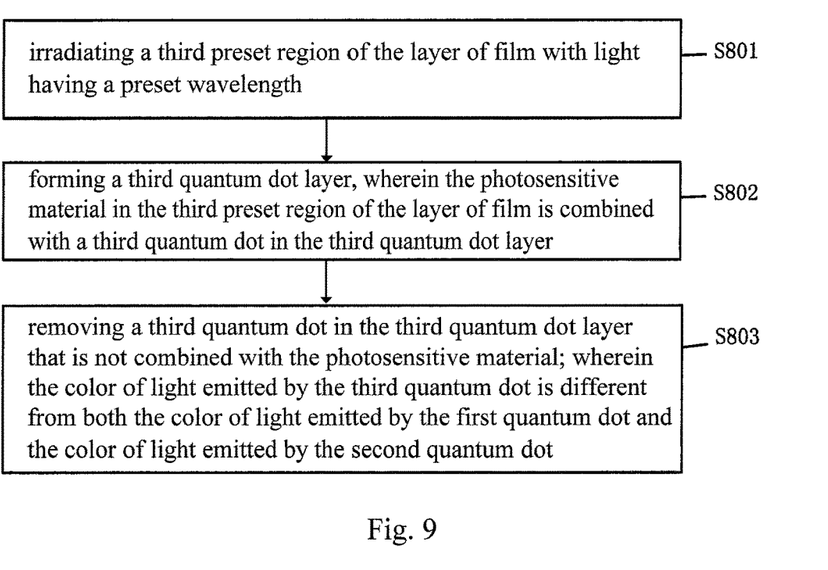
FIG. 9 is a flowchart of an additional step of patterning a quantum dot layer according to an embodiment of the present disclosure.

Further, in the embodiments of the present disclosure, in order to form full-color quantum dot, as shown in FIG. 9, the method of patterning a quantum dot layer further includes the steps of:

S801. irradiating a third preset region of the layer of film with light having a preset wavelength;

S802. forming a third quantum dot layer, wherein the photosensitive material in the third preset region of the layer of film is combined with a third quantum dot in the third quantum dot layer; and S803. removing a third quantum dot in the third quantum dot layer that is not combined with the photosensitive material; wherein the color of light emitted by the third quantum dot is different from both the color of light emitted by the first quantum dot and the color of light emitted by the second quantum dot.

Figure 10A:
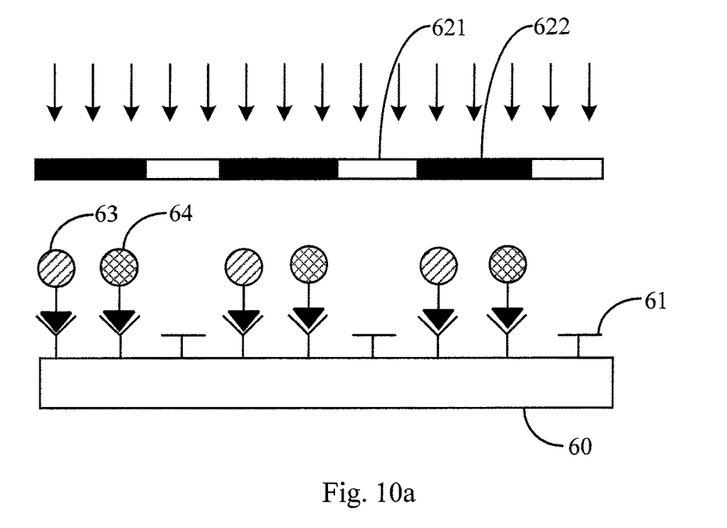
FIGS. 10a-10c are schematic diagrams showing a process of forming a third quantum dot layer according to an embodiment of the present disclosure.

As shown in FIG. 10a, a third preset region of the layer of film 61 is irradiated with light having a preset wavelength (indicated by an arrow in the figure), and the third preset region corresponds to the region in which the third quantum dot needs to be reserved subsequently. In the specific implementation, according to the embodiments of the present disclosure, the layer of film 61 may be irradiated with visible light at 533 nm. When irradiated, the layer of film 61 is masked with a mask, the light-transmitting region 621 of which corresponds to the third preset region of the layer of film 61.

Figure 10B:
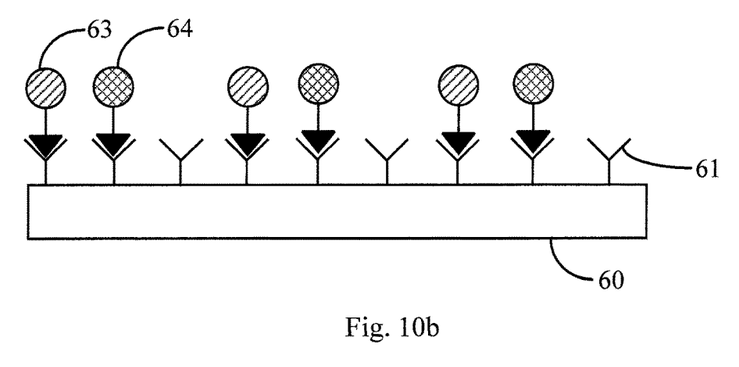

As shown in FIG. 10b, the configuration of the photosensitive material in the third preset region of the layer of film 61 is changed. In the specific implementation, the layer of film 61 contains, for example, an azobenzene photosensitive group, whose configuration is changed from a cis-configuration into a trans-configuration.

Figure 10C:
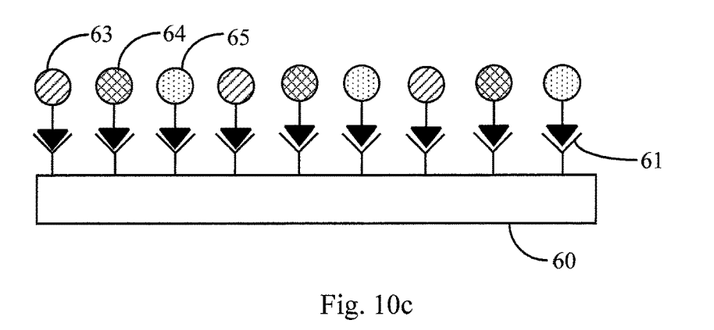

As shown in FIG. 10c, a third quantum dot layer 65 is then formed, and the third quantum dot in the third quantum dot layer 65 is combined with the photosensitive material in the third preset region of the layer of film 61. In the specific implementation, the third quantum dot layer 65 contains, for example, a quantum dot ligand having a structure of cyclodextrin. Since the azobenzene photosensitive group in the third preset region is in a trans-configuration, the third quantum dot in the third quantum dot layer 65 may be tightly combined with the photosensitive material in the third preset region.

In the specific implementation, in the embodiments of the present disclosure, after the first preset region of the layer of film is irradiated by the light having a preset wavelength, the mask may be so moved that the light-transmitting region of the mask corresponds to the second preset region of the layer of film, so as to conveniently carry out the irradiation of the second preset region of the layer of film by light having a preset wavelength. Afterward, the mask may be further moved so that the light-transmitting region of the mask corresponds to the third preset region of the layer of film, so as to conveniently carry out the irradiation of the third preset region of the layer of film by light having a preset wavelength. In this case, the mutual positional relationship between the layer of film and the mask should not affect the steps of forming quantum dot and the steps of removing quantum dot in the quantum dot layer that is not combined with the photosensitive material. In this way, in the embodiments of the present disclosure, by masking the layer of film with a mask in this manner, the process time may be saved and the production cost may be reduced.

In one embodiment, the color of light emitted by the first quantum dot, the color of light emitted by the second quantum dot, and the color of light emitted by the third quantum dot are red, green and blue respectively, so that a patterning process of full-color quantum dot may be realized by the above method. The embodiments of the present disclosure may realize the patterning of quantum dot layer without ink jet printing or photolithography, and may form quantum dot with a high-resolution and good-performance.

In the above embodiments, the photosensitive group and the quantum dot ligand used in the embodiments of the present disclosure are illustrated by taking azobenzene groups and cyclodextrin as examples. However, it should be understood that the embodiments of the present disclosure are not limited thereto. For example, the photosensitive group may be different from the azobenzene group shown in FIG. 2, for example, may have a substituent group on a benzene ring or a linking group linked to dioctylfluorene, as long as it does not affect the fitting with the quantum dot ligand, and the linking group may have different lengths. It should be understood that, when the photosensitive groups are different, the preset wavelength of the light used to irradiate the layer of film may also be different. In addition, as long as the quantum dot ligand has different combining forces with respect to the photosensitive group in different configurations, the quantum dot ligand is not limited to the cyclodextrin, and may be other suitable molecules or groups in cage configuration, such as cucurbituril.

Based on the same concept, the embodiments of the present disclosure further provide a method of manufacturing a quantum dot light emitting device, which includes the steps of fabricating an anode, a quantum dot layer and a cathode, wherein the quantum dot layer is formed by using the above method of patterning a quantum dot layer.

Figure 11:
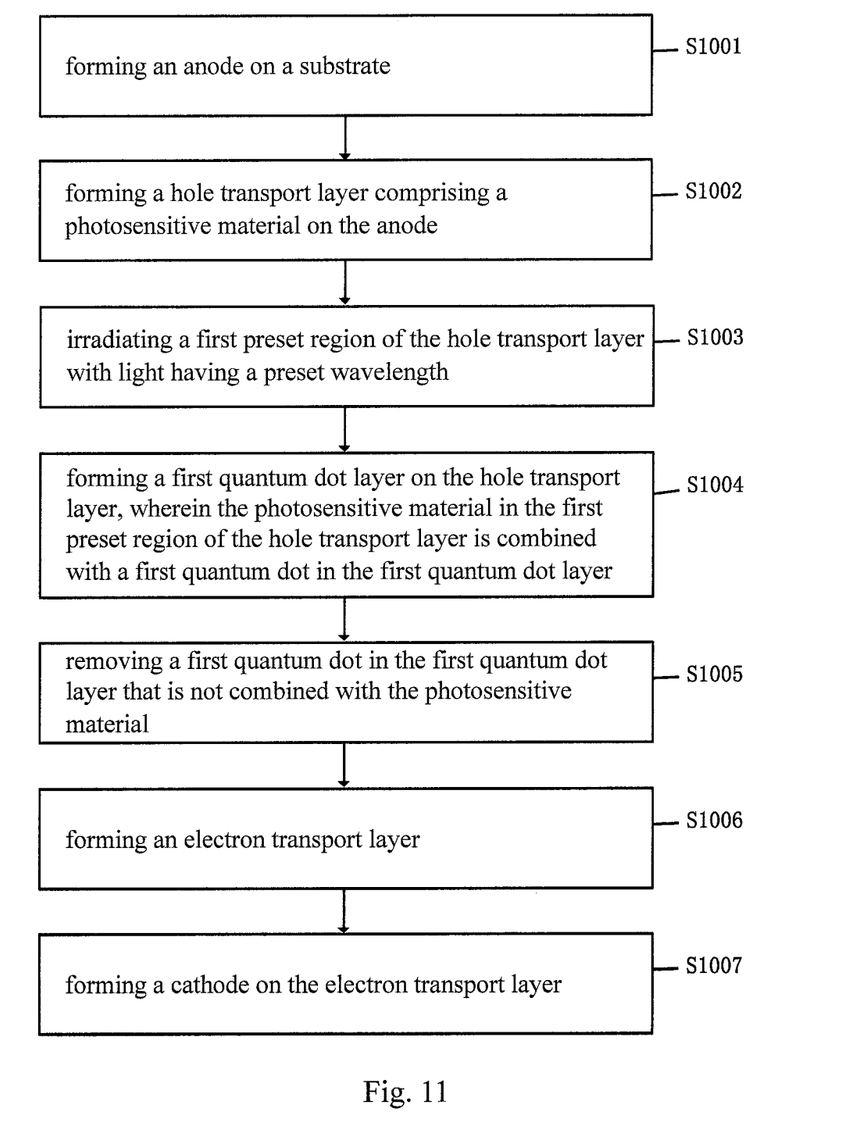
FIG. 11 is a flowchart of a method of manufacturing a quantum dot light emitting device according to a specific embodiment of the present disclosure.

In one embodiment, as shown in FIG. 11, the method of manufacturing a quantum dot light emitting device includes the steps of:

S1001. forming an anode on a substrate;

S1002. forming a hole transport layer comprising a photosensitive material on the anode;

S1003. irradiating a first preset region of the hole transport layer with light having a preset wavelength;

S1004. forming a first quantum dot layer on the hole transport layer, wherein the photosensitive material in the first preset region of the hole transport layer is combined with a first quantum dot in the first quantum dot layer;

S1005. removing a first quantum dot in the first quantum dot layer that is not combined with the photosensitive material;

S1006. forming an electron transport layer; and

S1007. forming a cathode on the electron transport layer.

In one embodiment, in order that the manufactured quantum dot light emitting device have better light emitting performance, prior to step S1002, the method further includes: forming a hole injection layer on the anode. In the embodiments of the present disclosure, the above steps S1003, S1004 and S1005 are similar to the above steps S102, S103 and S104, and details thereof are not iterated here.

In addition, in the embodiments of the present disclosure, after the cathode is fabricated, the method further includes a packaging process, a cutting process, and a bonding process for the quantum dot light emitting device.

The process of manufacturing the quantum dot light emitting device according to the embodiments of the present disclosure is briefly described below with reference to FIG. 12.

Figure 12:
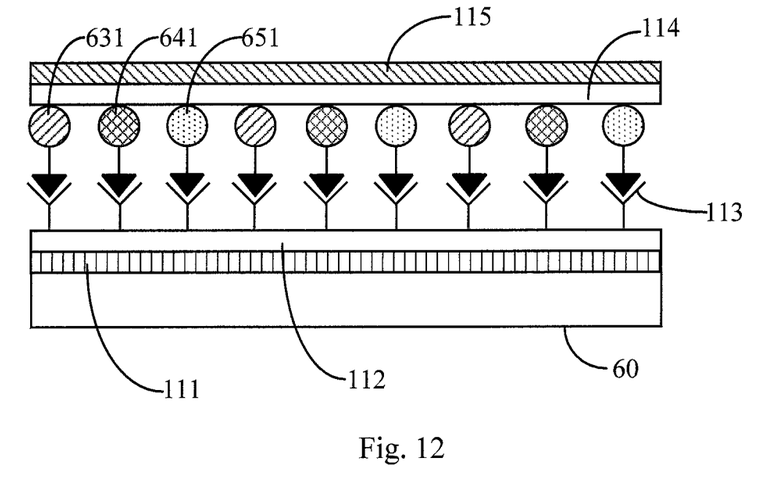
FIG. 12 is a schematic structural diagram of a quantum dot light emitting device according to a specific embodiment of the present disclosure.

As shown in FIG. 12, in the embodiments of the present disclosure, an anode 111 is formed on a substrate 60 using a patterning process. Next, a hole injection layer 112 is formed on the anode 111. In one example, the hole injection layer 112 is dried and annealed; next, a hole transport layer 113 comprising a photosensitive material is formed on the hole injection layer 112. In one example, the hole transport layer 113 is dried and annealed. As shown in FIG. 12, next, a red quantum dot 631, a green quantum dot 641, and a blue quantum dot 651 are formed on the hole transport layer 113 by the above method of patterning a quantum dot layer. Then, an electron transport layer 114 is formed on the red quantum dot 631, the green quantum dot 641, and the blue quantum dot 651. In a specific implementation, the electron transport layer 114 may be formed as a zinc oxide (ZnO) nanoparticle layer. Then, a cathode 115 was formed on the electron transport layer 114 using a patterning process.

Based on the same concept, the embodiments of the present disclosure further provide a quantum dot light emitting device. The quantum dot light emitting device is manufactured by the above method of manufacturing a quantum dot light emitting device.

In summary, the embodiments of the present disclosure utilize the characteristic that the configuration of certain photosensitive materials will be changed under the irradiation of light having a specific wavelength. A photosensitive group is contained in the layer of photosensitive material film under the quantum dot layer, and meanwhile the quantum dot includes a quantum dot ligand. The quantum dot ligand may be tightly combined with the photosensitive group in a certain configuration in the photosensitive material. In this way, by irradiating a preset region of the layer of photosensitive material film with light having a preset wavelength, the adhesion between a part of the layer of photosensitive material film and the quantum dot is relatively strong, while the adhesion between other regions and the quantum dot is relatively weak, so that after the formation of the quantum dot layer later, the quantum dot in the region where the adhesion is relatively weak may be washed away, leaving a patterned quantum dot.

The above are only some embodiments of the present disclosure, and it should be noted that various improvements and changes may be made by those skilled in the art without departing from the principle of the present disclosure, and these improvements and changes should fall within the scope of protection of the present disclosure.

What is claimed is:

1. A method of patterning a quantum dot layer, comprising the steps of:

forming on a substrate a layer of film comprising a photosensitive material;

irradiating a first preset region of the layer of film with light having a preset wavelength;

forming a first quantum dot layer, wherein the photosensitive material in the first preset region of the layer of film is combined with a first quantum dot in the first quantum dot layer;

removing a first quantum dot in the first quantum dot layer that is not combined with the photosensitive material;

irradiating a second preset region of the layer of film with light having a preset wavelength;

forming a second quantum dot layer, wherein the photosensitive material in the second preset region of the layer of film is combined with a second quantum dot in the second quantum dot layer; and removing a second quantum dot in the second quantum dot layer that is not combined with the photosensitive material;

wherein a color of light emitted by the second quantum dot is different from a color of light emitted by the first quantum dot.

2. The method according to claim 1, wherein the photosensitive material has a first configuration, and the step of irradiating a first preset region of the layer of film with light having a preset wavelength changes the photosensitive material in the first preset region of the layer of film into a second configuration.

3. The method according to claim 2, wherein the first quantum dot comprises a quantum dot ligand capable of combining with the photosensitive material in the second configuration.

4. The method according to claim 3, wherein the quantum dot ligand has a structure of cyclodextrin; and the photosensitive material comprises an azobenzene photosensitive group.

5. The method according to claim 1, further comprising drying and annealing the first quantum dot layer after the step of forming the first quantum dot layer.

6. The method according to claim 1, further comprising the steps of:

irradiating a third preset region of the layer of film with light having a preset wavelength;

forming a third quantum dot layer, wherein the photosensitive material in the third preset region of the layer of film is combined with a third quantum dot in the third quantum dot layer; and removing a third quantum dot in the third quantum dot layer that is not combined with the photosensitive material;

wherein a color of light emitted by the third quantum dot is different from both the color of light emitted by the first quantum dot and the color of light emitted by the second quantum dot.

7. The method according to claim 6, wherein the color of light emitted by the first quantum dot, the color of light emitted by the second quantum dot and the color of light emitted by the third quantum dot each are different colors selected from a group consisting of red, green, and blue.

8. The method according to claim 1, wherein in the step of irradiating a first preset region of the layer of film with light having a preset wavelength, the layer of film is masked with a mask comprising a light-transmitting region and a light-blocking region, the light-transmitting region corresponding to the first preset region to be irradiated of the layer of film.

9. The method according to claim 1, wherein the first quantum dot in the first quantum dot layer that is not combined with the photosensitive material is removed by a solvent.

10. The method according to claim 1, wherein the layer of film comprising a photosensitive material is a hole transport layer.

11. A method of manufacturing a quantum dot light emitting device, comprising the steps of:
forming an anode on a substrate;
forming a hole transport layer comprising a photosensitive material on the anode;
irradiating a first preset region of the hole transport layer with light having a preset wavelength;
forming a first quantum dot layer on the hole transport layer, wherein the photosensitive material in the first preset region of the hole transport layer is combined with a first quantum dot in the first quantum dot layer;
removing a first quantum dot in the first quantum dot layer that is not combined with the photosensitive material;
irradiating a second preset region of the hole transport layer with light having a preset wavelength;
forming a second quantum dot layer, wherein the photosensitive material in the second preset region of the hole transport layer is combined with a second quantum dot in the second quantum dot layer;
removing a second quantum dot in the second quantum dot layer that is not combined with the photosensitive material;
forming an electron transport layer; and
forming a cathode on the electron transport layer,
wherein a color of light emitted by the second quantum dot is different from a color of light emitted by the first quantum dot.

12. The method according to claim 11, wherein the photosensitive material has a first configuration, and the step of irradiating a first preset region of the hole transport layer with light having a preset wavelength changes the photosensitive material in the first preset region of the hole transport layer into a second configuration.

13. The method according to claim 12, wherein the first quantum dot comprises a quantum dot ligand capable of combining with the photosensitive material in the second configuration.

14. The method according to claim 11, further comprising the following steps before forming the electron transport layer:
irradiating a third preset region of the hole transport layer with light having a preset wavelength;
forming a third quantum dot layer, wherein the photosensitive material in the third preset region of the hole transport layer is combined with a third quantum dot in the third quantum dot layer; and
removing a third quantum dot in the third quantum dot layer that is not combined with the photosensitive material;
wherein a color of light emitted by the third quantum dot is different from both the color of light emitted by the first quantum dot and the color of light emitted by the second quantum dot.

15. The method according to claim 11, wherein the first quantum dot in the first quantum dot layer that is not combined with the photosensitive material is removed by a solvent.

16. The method according to claim 11, wherein the quantum dot ligand has a structure of cyclodextrin; and the photosensitive material comprises an azobenzene photosensitive group.

17. The method according to claim 11, further comprising forming a hole injection layer on the anode prior to the step of forming a hole transport layer comprising a photosensitive material on the anode.

18. A quantum dot light emitting device manufactured by the method of manufacturing a quantum dot light emitting device according to claim 11.

* * * * *